United States Patent
Yu et al.

(10) Patent No.: US 9,355,708 B2
(45) Date of Patent: May 31, 2016

(54) MEMORY CONTROL CIRCUIT FOR ADJUSTING REFERENCE VOLTAGE AND ASSOCIATED MEMORY CONTROL METHOD

(71) Applicant: Realtek Semiconductor Corp., HsinChu (TW)

(72) Inventors: Chun-Chi Yu, Hsinchu County (TW); Chih-Wei Chang, Hsinchu County (TW); Shen-Kuo Huang, Hsinchu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/659,629

(22) Filed: Mar. 17, 2015

(65) Prior Publication Data
US 2016/0035411 A1 Feb. 4, 2016

(30) Foreign Application Priority Data
Aug. 4, 2014 (TW) .............................. 103126635 A

(51) Int. Cl.
G11C 7/00 (2006.01)
G11C 11/4091 (2006.01)
G11C 11/4076 (2006.01)

(52) U.S. Cl.
CPC ........ *G11C 11/4091* (2013.01); *G11C 11/4076* (2013.01)

(58) Field of Classification Search
CPC ....... G11C 7/1006; G11C 7/14; G11C 11/062
USPC .......................... 365/189.07, 189.09, 189.04
IPC ............................... G11C 7/1006, 7/14, 11/062
See application file for complete search history.

(56) References Cited

U.S. PATENT DOCUMENTS

| | | | |
|---|---|---|---|
| 7,162,376 B2 * | 1/2007 | Oh ........................ | G11C 5/147 365/189.09 |
| 7,356,716 B2 * | 4/2008 | Boerstler .................. | G06F 1/26 327/540 |
| 8,923,442 B2 * | 12/2014 | Chandrasekaran ..... | H04L 25/06 375/224 |
| 2011/0075496 A1 * | 3/2011 | Mueller ............. | G06F 13/1694 365/193 |

* cited by examiner

*Primary Examiner* — Connie Yoha
(74) *Attorney, Agent, or Firm* — Winston Hsu; Scott Margo

(57) ABSTRACT

A memory control circuit includes a comparator, an eye width measuring circuit and a calibration circuit, wherein the comparator is arranged to compare a data signal with a reference voltage to generate a compared data signal; the eye width measuring circuit is coupled to the comparator, and is arranged to measure an eye width of the compared data signal to generate a measuring result; and the calibration circuit is coupled to the comparator and the eye width measuring circuit, and is arranged to adjust a level of the reference voltage according to the measuring result.

14 Claims, 5 Drawing Sheets

MEMORY CONTROL CIRCUIT FOR ADJUSTING REFERENCE VOLTAGE AND ASSOCIATED MEMORY CONTROL METHOD

BACKGROUND OF THE INVENTION

1. Field of the Invention

The present invention relates to a memory, and more particularly, to a memory control circuit and associated memory control method.

2. Description of the Prior Art

After Synchronous Dynamic Random-Access Memory (SDRAM) evolved to DDR4 and LPDDR4, a reference voltage of a memory control circuit for generating a data signal is not a fixed value anymore because of using the architecture of Pseudo Open Drain (POD). Therefore, how to decide the best reference voltage to read the data in the memory fast is an important issue.

SUMMARY OF THE INVENTION

One of the objectives of the present invention is to provide a memory control circuit and associated memory control method, which can obtain the best value of the reference voltage fast, and the best value of the reference voltage can be adjusted constantly when reading data in memory, to read the data of the memory fast and correctly.

According to an embodiment of the present invention, a memory control circuit comprises a comparator, an eye width measuring circuit and a calibration circuit, wherein the comparator is arranged to compare a data signal with a reference voltage to generate a compared data signal; the eye width measuring circuit is coupled to the comparator, and is arranged to measure the eye width of the compared data signal to generate a measuring result; and the calibration circuit is coupled to the comparator and the eye width measuring circuit, and is arranged to adjust a level of the reference voltage according to the measuring result.

According to another embodiment of the present invention, a memory control method comprises: comparing a data signal with a reference voltage to generate a compared data signal; measuring the eye width of the compared data signal to generate a measuring result; and adjusting a level of the reference voltage according to the measuring result.

According to another embodiment of the present invention, a memory control circuit comprises a comparator, a duty cycle detector circuit and a calibration circuit, wherein the comparator is arranged to compare a data signal with a reference voltage to generate a compared data signal; the duty cycle detector circuit is coupled to the comparator, and is arranged to detect a duty cycle of the compared data signal to generate a detecting result; and the calibration circuit is coupled to the comparator and the duty cycle detector circuit, and is arranged to adjust a level of the reference voltage according to the detecting result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
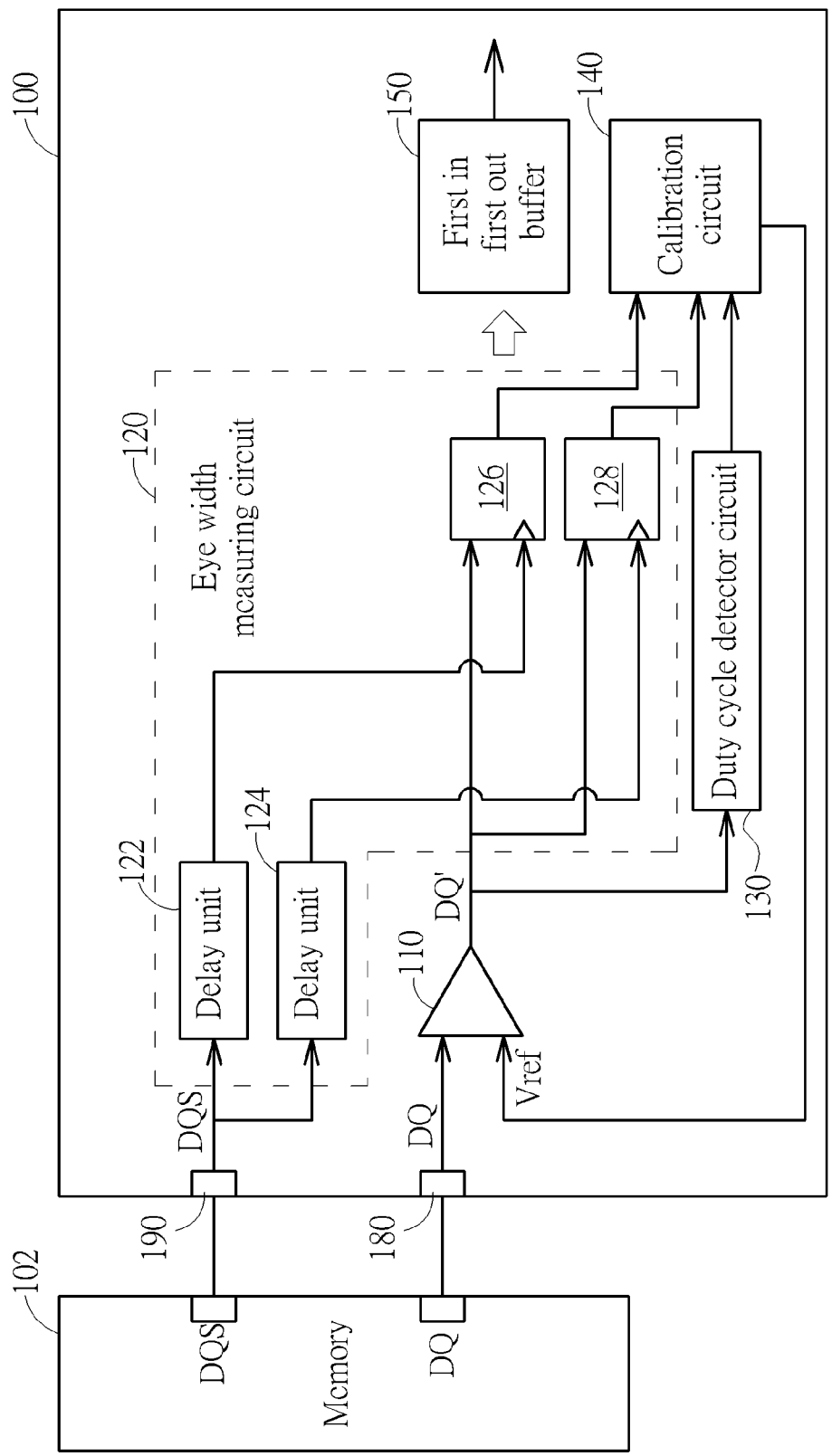
FIG. 1 is a diagram illustrating a memory control circuit according to an embodiment of the present invention.

Refer to FIG. 1, which is a diagram illustrating a memory control circuit 100 according to an embodiment of the present invention. The memory control circuit 100 is connected to a memory 102, and comprises a comparator 110, an eye width measuring circuit 120, a duty cycle detector circuit 130, a calibration circuit 140, a first in first out (FIFO) buffer 150, a node 180 for receiving a data signal (DQ) and a node 190 for receiving a clock signal (i.e. a data strobe (DQS)), wherein the eye width measuring circuit 120 comprises two delay units 122 and 124 and two D flip-flops 126 and 128 serving as sample units, and the delay amount of the delay units 122 and 124 are controlled and adjusted by other control units in the memory control circuit 100. In this embodiment, the memory control circuit 100 is a SDRAM control circuit, and the memory 102 is a SDRAM.

In particular, for the brevity, the memory control circuit 100 depicted in FIG. 1 only comprises the parts relate to the present invention. The skilled person in the art should understand the memory control circuit 100 comprises other necessary circuit elements.

Figure 2:
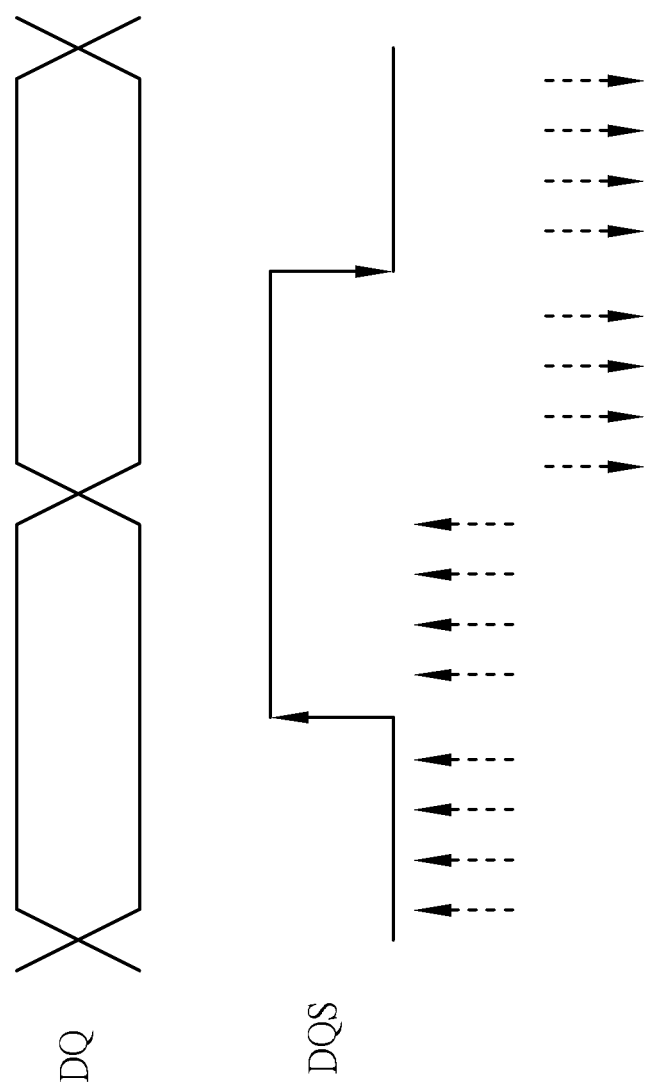
FIG. 2 is a diagram illustrating the operation of an eye width measuring circuit according to an embodiment of the present invention.

Refer to FIG. 2, which is a diagram illustrating an eye width measuring circuit 120 according to an embodiment of the present invention. In a traditional memory control circuit, the memory control circuit utilizes the rising edge of the data strobe DQS to sample the data signal DQ and utilizes the falling edge of the data strobe DQS to sample the next bit of the data signal DQ to generate an output data to the first in first out buffer 150 then to the following data bus. In the eye width measuring circuit 120 in FIG. 1, the delay amount of the delay elements 122 and 124 can be adjusted constantly to generate data strobes DQS with different phases, and the D flip-flops 126 and 128 use a plurality of data strobes DQS with different phases to sample (i.e. over-sampling operation) and to decide the eye width of data signal DQ. On the other hand, if the data signal DQ is a 0/1 toggle pattern data signal, the eye width measuring circuit 120 can decide the eye width corresponding to bit value "0" and "1". In addition, the eye width measuring circuit 120 in FIG. 1 is only an example, not a limitation of the present invention. For example, the quantity of the delay elements and the D flip-flops in the eye width measuring circuit 120 can be changed according to the request of designer, and the eye width measuring circuit 120 can also use any other circuit design which can detect the eye width of signal.

The memory control circuit 100 in FIG. 1 can calibrate the reference voltage Vref received by the comparator 110 fast and accurately to make the reference voltage Vref the best/optimal value to read the data of memory fast and correctly. And the flow of the memory control circuit 100 calibrating the reference voltage Vref can be divided into foreground calibration and background calibration, wherein the purpose of the foreground calibration is to find the best value of the reference voltage Vref when the electronic device turns on, and the purpose of the background calibration is to keep optimizing the reference voltage Vref when the memory control circuit 100 reads the memory 102.

Figure 3:
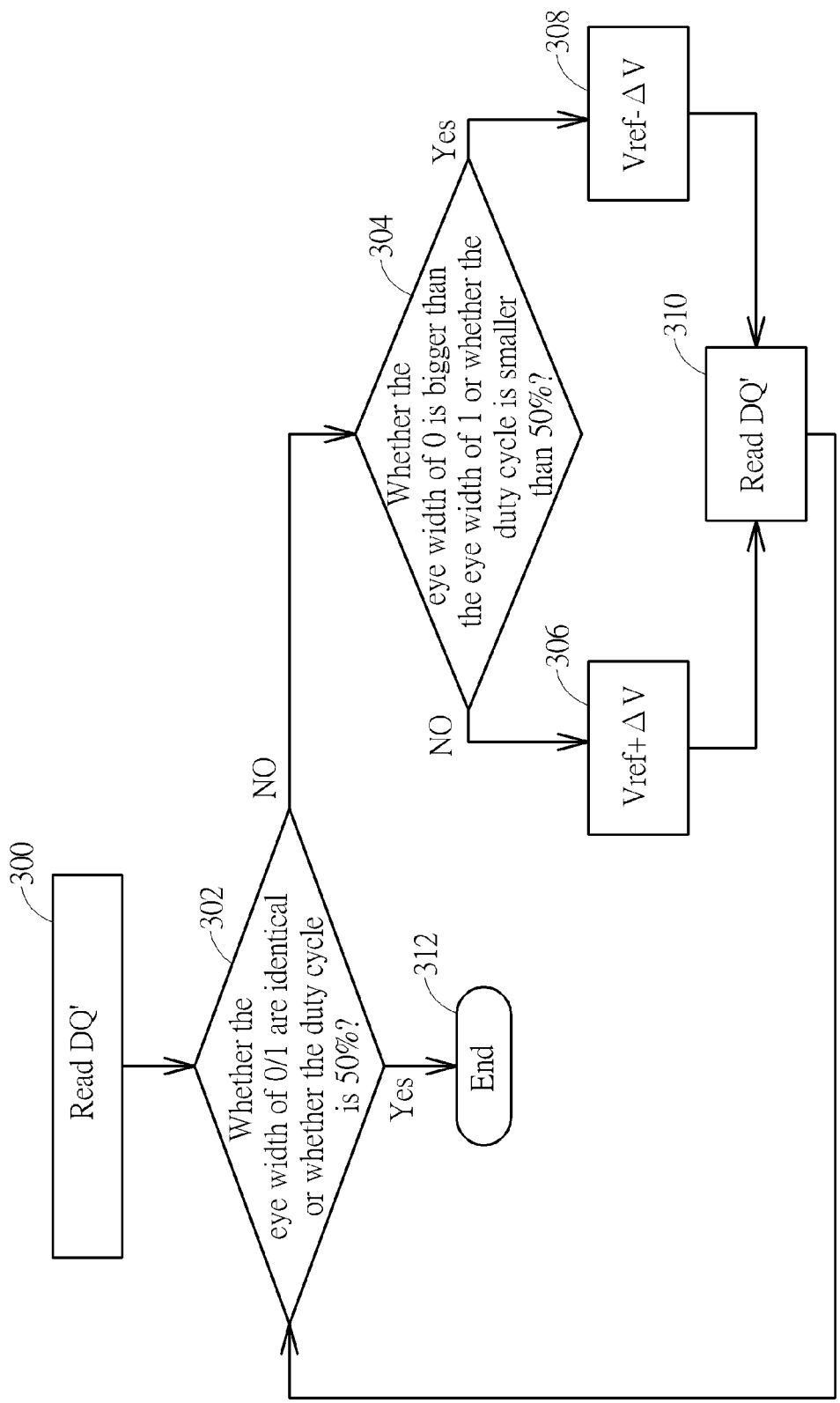
FIG. 3 is a flowchart illustrating a memory control method according to an embodiment of the present invention.

First, for the foreground calibration, refer to FIG. 1 and FIG. 3 in the same time. FIG. 3 is a flowchart illustrating a memory control method according to an embodiment of the present invention. First, a circuit of the memory control circuit 100 generates a 0/1 toggle pattern data signal to the node 180 as the data signal DQ when the electronic device which comprises the memory control circuit 100 turns on, then the comparator 110 reads the data signal DQ, and compares the data signal DQ with a predetermined reference voltage Vref to generate a compared data signal DQ'. Then, in step 300, the eye width measuring circuit 120 reads the compared signal data DQ', then measures the eye width corresponding to the bit value "0" and "1" in the compared data signal DQ' to generate a measuring result to the calibration circuit 140. In the same time, the duty cycle detector circuit 130 reads the compared data signal DQ' as well, and detects the duty cycle of the compared data signal DQ' to generate a detecting result to the calibration circuit 140. Next, in step 302, the calibration circuit 140 decides if the eye width corresponding to the bit value "0" and "1" in the compared data signal DQ' are identical, and decides if the duty cycle of the compared data signal DQ' is 50%, wherein if the eye width corresponding to the bit value "0" and "1" in the compared data signal DQ' are identical, or the duty cycle of the compared data signal DQ' is 50%, that means the present reference voltage Vref is the best value, therefore, the flow moves to step 312 and ends the calibration flow. Otherwise, the flow moves to step 304.

In step 304, the calibration circuit 140 decides if the eye width corresponding to the bit value "0" in the compared data signal DQ' is bigger than the eye width corresponding to the bit value "1" in the compared data signal DQ', and also decides if the duty cycle of the compared data signal DQ' is less than 50% (i.e. the period corresponding to bit value "0" is smaller than the period corresponding to bit value "1"), wherein if the eye width corresponding to the bit value "0" in the compared data signal DQ' is bigger than the eye width corresponding to the bit value "1" in the compared data signal DQ', or the duty cycle of the compared data signal DQ' is less than 50%, then the flow moves to step 308 to decrease the reference voltage Vref, wherein the decreased value ΔV can be any suitable value; otherwise, the flow moves to step 306 to increase the reference voltage Vref, wherein the increased value ΔV can also be any suitable value. Next, the flows moves to step 310 to read the compared data signal DQ', and repeats the abovementioned steps until the eye width corresponding to bit value "0" and "1" in the compared data signal DQ' are identical, or the duty cycle of the compared data signal DQ' is 50%.

In particular, in the embodiments of FIG. 1 and FIG. 3, both the measuring result generated by the eye width measuring circuit 120 and the detecting result generated by the duty cycle detector circuit 130 are used to decide to increase or decrease the reference voltage Vref, however, in other embodiments of the present invention, the memory control circuit 100 can only use one of the eye width measuring circuit 120 and the duty cycle detector circuit 130 to calibrate the reference voltage Vref, that is the calibration circuit 140 can adjust the reference voltage Vref only according to the eye width corresponding to the bit value "0" and "1" in the compared data signal DQ' generated by the eye width measuring circuit 120, or adjust the reference voltage Vref only according to the duty cycle of the compared data signal DQ' generated by the duty cycle detector circuit 130, these alternative designs should fall within the scope of this invention.

Figure 4:
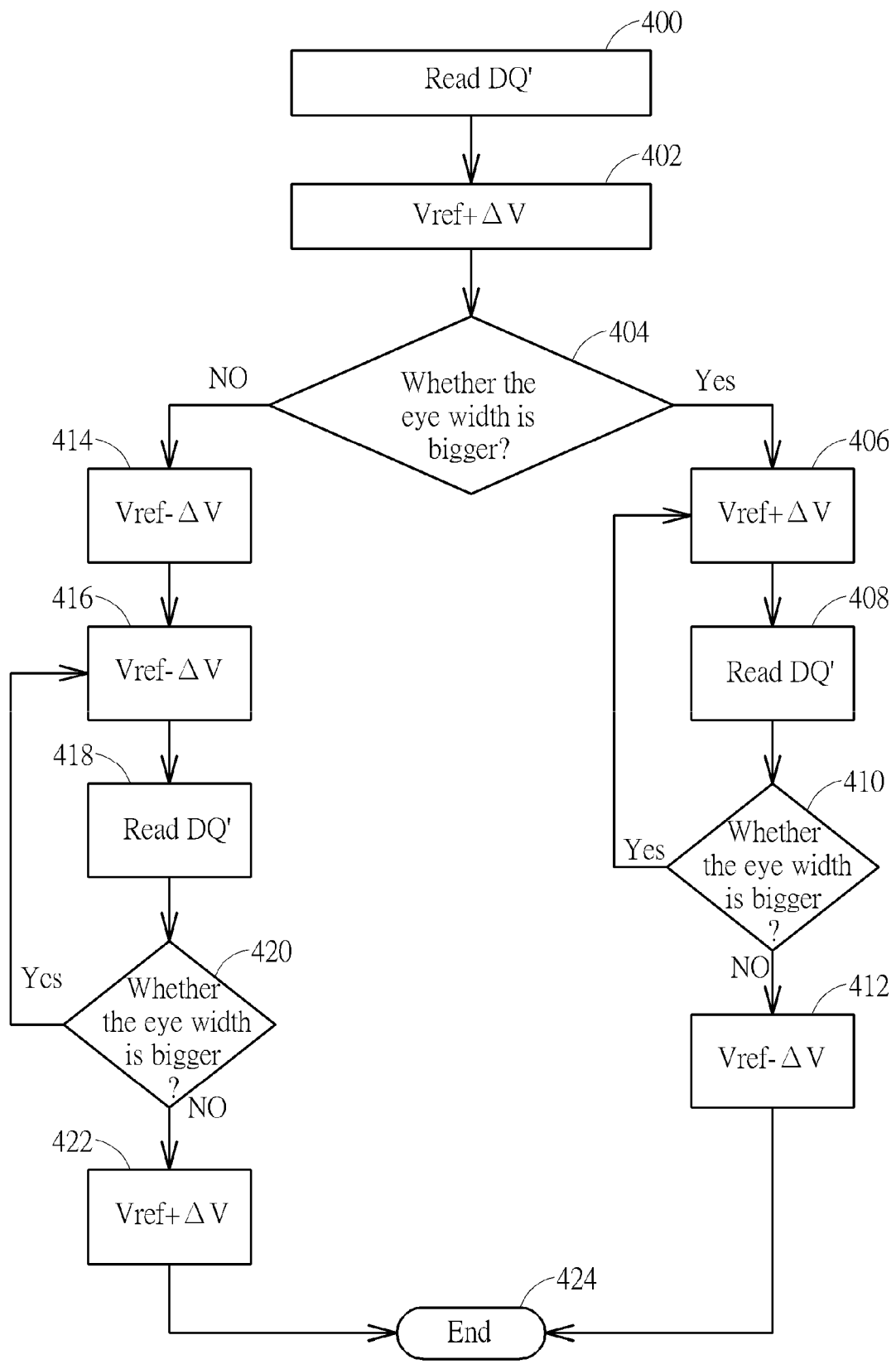
FIG. 4 is a flowchart illustrating a memory control method according to another embodiment of the present invention.

In addition, refer to FIG. 1 and FIG. 4 in the same time. FIG. 4 is a diagram illustrating a memory control method according to another embodiment of the present invention, wherein the embodiment of FIG. 4 can be used in foreground calibration or background calibration. First, the comparator 110 reads the data signal DQ, and compares the data signal DQ with a predetermined reference voltage Vref to generate a compared data signal DQ', wherein the data signal DQ is random data generated from a circuit of the memory control circuit 100 to the node 180 when performing the foreground calibration, and the data signal DQ is received by the memory 102 when performing the background calibration. In step 400, the eye width measuring circuit 120 reads the compared data signal DQ', and measures the eye width of the compared data signal DQ' to generate a measuring result to calibration circuit 140. Next, in step 402, the calibration circuit 140 adds ΔV on the reference voltage Vref actively, and observes if the eye width of the compared data signal DQ' is bigger thus in step 404. If the eye width of the compared data signal DQ' is bigger, then the flow moves to step 406 to keep increasing the reference voltage Vref and reads the compared data signal DQ' and measures the eye width of the compared data signal DQ' repeatedly to decide if the eye width is getting bigger (steps 408 and 410), and when the eye width stops getting bigger, the calibration circuit 140 subtracts ΔV from the present reference voltage Vref as the best reference voltage Vref (step 412), and moves to step 424 to end the flow.

On the other hand, when the eye width of the compared data signal DQ' isn't bigger in step 404, the flow moves to step 414 to subtract ΔV from the reference voltage Vref, then the flow moves to step 416 to keep decreasing the reference voltage Vref, and reads the compared data signal DQ' and measures the eye width of the compared data signal DQ' repeatedly to decide if the eye width is getting bigger (steps 418 and 420), and when the eye width stops getting bigger, the calibration circuit 140 adds ΔV on the present reference voltage Vref as the best reference voltage Vref (step 422), and the flow moves to step 424 to end the flow.

Figure 5:
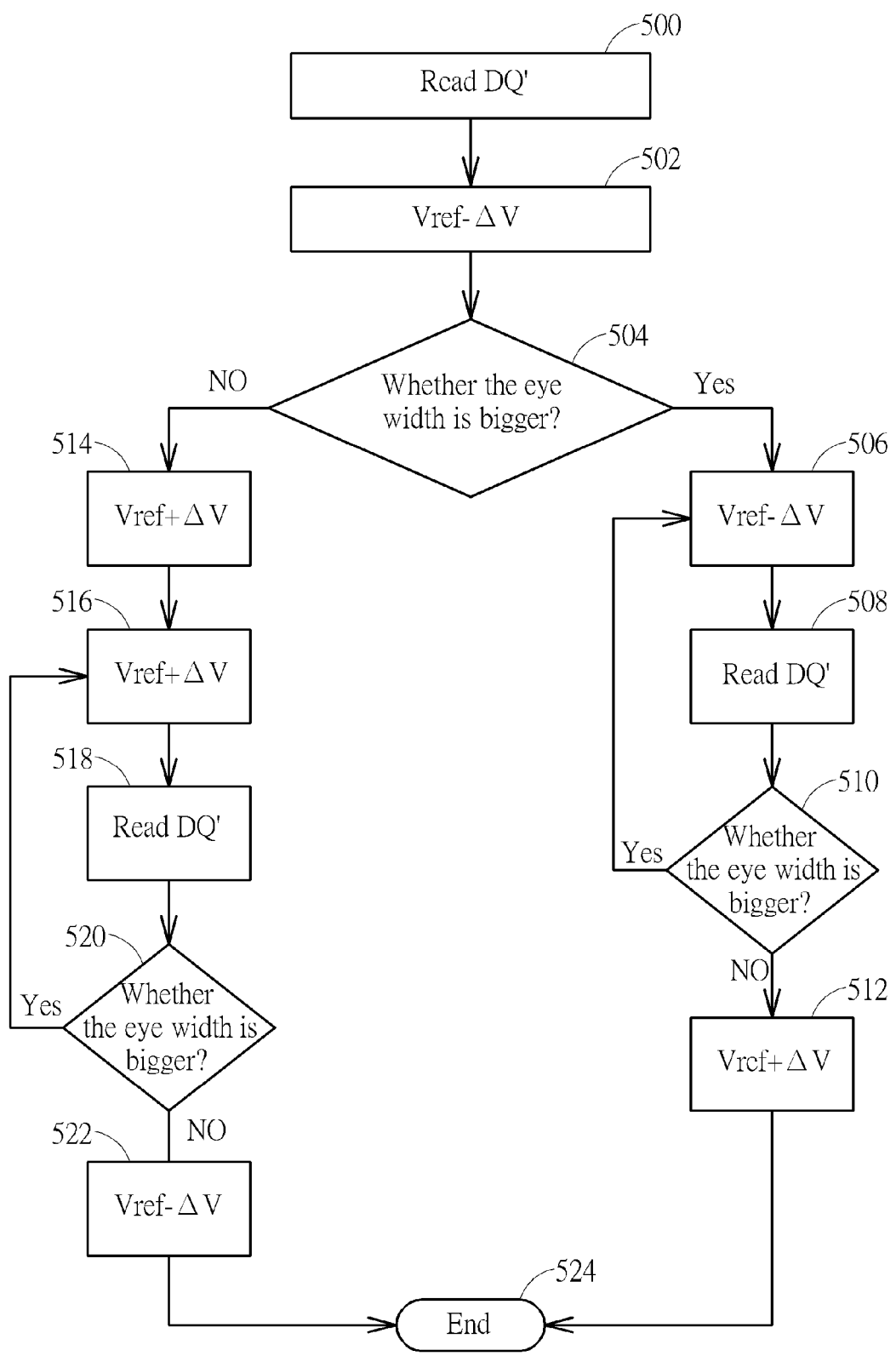
FIG. 5 is a flowchart illustrating a memory control method according to another embodiment of the present invention.

In addition, refer to FIG. 1 and FIG. 5 in the same time. FIG. 5 is a diagram illustrating a memory control method according to another embodiment of the present invention, wherein the embodiment of FIG. 5 can be used in foreground calibration or background calibration. First, the comparator 110 reads the data signal DQ, and compares the data signal DQ with a predetermined reference voltage Vref to generate a compared data signal DQ', wherein the data signal DQ is a random data generated from a circuit of the memory control circuit 100 to the node 180 when performing the foreground calibration, and the data signal DQ is received by the memory 102 when performing the background calibration. In step 500, the eye width measuring circuit 120 reads the compared data signal DQ', and measures the eye width of the compared data signal DQ' to generate a measuring result to calibration circuit 140. Next, in step 502, the calibration circuit 140 subtracts ΔV from the reference voltage Vref actively, and observes if the eye width of the compared data signal DQ' is bigger thus in step 504? If the eye width of the compared data signal DQ' is bigger, then the flow moves to step 506 to keep decreasing the reference voltage Vref and reads the compared data signal DQ' and measures the eye width of the compared data signal DQ' repeatedly to decide if the eye width is getting bigger (steps 508 and 510), and when the eye width stops getting bigger, the calibration circuit 140 adds ΔV on the present reference voltage Vref as the best reference voltage Vref (step 512), and moves to step 524 to end the flow.

On the other hand, when the eye width of the compared data signal DQ' isn't bigger in step 504, the flow moves to step 514 to add ΔV on the reference voltage Vref, then the flow moves to step 516 to keep increasing the level of the reference voltage Vref, and reads the compared data signal DQ' and measures the eye width of the compared data signal DQ' repeatedly to decide if the eye width is getting bigger (steps 518 and 520), and when the eye width stops getting bigger, the calibration circuit 140 subtracts ΔV from the present reference voltage Vref as the best reference voltage Vref (step 522), and the flow moves to step 524 to end the flow.

In addition, the abovementioned background calibration can adjust the reference voltage Vref when the memory control circuit 100 doesn't need to read the data of the memory 102 to make the compared data signal DQ' can maintain the biggest eye width.

Briefly summarized, in the memory control circuit and associated memory control method of the present invention, it can decide the best reference voltage Vref when the electronic device turns on via the foreground calibration, and also can adjust the reference voltage Vref constantly when reading the data of the memory 102 via background calibration to keep the compared data signal DQ' having the biggest eye width all the time. Therefore, the best value of the reference voltage can be obtained at any time and fast via the present invention to read the data of the memory fast and correctly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory control circuit, comprising:
   a comparator arranged to compare a data signal with a reference voltage to generate a compared data signal;
   an eye width measuring circuit, coupled to the comparator, arranged to measure an eye width of the compared data signal by using a plurality of first clock signals with different phases to generate a measuring result; and
   a calibration circuit, coupled to the comparator and the eye width measuring circuit, arranged to adjust a level of the reference voltage according to the measuring result.

2. The memory control circuit of claim 1, wherein the data signal is a 0/1 toggle pattern data signal, and the eye width measuring circuit receives a second clock signal, and adjusts a phase of the second clock signal to generate the plurality of first clock signals with different phases to sample the compared data signal to measure eye widths corresponding to bit values "0" and "1" in the compared data signal to generate the measuring result.

3. The memory control circuit of claim 1, wherein the measuring result comprises the eye widths corresponding to the bit value "0" and "1" in the compared data signal, and the calibration circuit decreases the level of the reference voltage when the measuring result indicates that the eye width corresponding to the bit value "0" in the compared data signal is bigger than the eye width corresponding to the bit value "1" in the compared data signal; and the calibration circuit increases the level of the reference voltage when the measuring result indicates that the eye width corresponding to the bit value "0" in the compared data signal is smaller than the eye width corresponding to the bit value "1" in the compared data signal.

4. The memory control circuit of claim 1, wherein the data signal is a 0/1 toggle pattern data signal, and the memory control circuit further comprises:
   a duty cycle detector circuit arranged to detect a duty cycle of the compared data signal to generate a detecting result;
   wherein the calibration circuit adjusts the level of the reference voltage according to the detecting result.

5. The memory control circuit of claim 4, wherein the calibration circuit decreases the level of the reference voltage when the detecting result indicates that the duty cycle of the compared data signal is less than 50%; and the calibration circuit increases the level of the reference voltage when the detecting result indicates that the duty cycle of the compared data signal is bigger than 50%.

6. The memory control circuit of claim 1, wherein the calibration circuit actively adjusts the level of the reference voltage first, and keeps increasing or decreasing the level of the reference voltage according to the measuring result generated by the eye width measuring circuit until the measuring result generated by the eye width measuring circuit indicates that the eye width of the compared data signal reaches a maximum value.

7. A memory control method, comprising:
   comparing a data signal with a reference voltage to generate a compared data signal;
   measuring an eye width of the compared data signal by using a plurality of first clock signals with different phases to generate a measuring result; and
   adjusting a level of the reference voltage according to the measuring result.

8. The memory control method of claim 7, wherein the data signal is a 0/1 toggle pattern data signal, and the step of measuring the eye width of the compared data signal to generate the measuring result comprises:
   receiving a second clock signal and adjusting a phase of the second clock signal to generate the plurality of first clock signals with different phases to sample the compared data signal to measure eye widths corresponding to the bit value "0" and "1" in the compared data signal, and generate the measuring result.

9. The memory control method of claim 7, wherein the measuring result comprises the eye widths corresponding to the bit value "0" and "1" in the compared data signal, and the step of adjusting the level of the reference voltage according to the measuring result comprises:
   decreasing the level of the reference voltage when the measuring result indicates that the eye width corresponding to the bit value "0" in the compared data signal is bigger than the eye width corresponding to the bit value "1" in the compared data signal; and
   increasing the level of the reference voltage when the measuring result indicates that the eye width corresponding to the bit value "0" in the compared data signal is smaller than the eye width corresponding to the bit value "1" in the compared data signal.

10. The memory control method of claim 7, wherein the data signal is a 0/1 toggle pattern data signal, and the memory control method further comprising:

detecting the duty cycle of the compared data signal to generate a detecting result; and adjusting the level of the reference voltage according to the detecting result.

11. The memory control method of claim 10, further comprising:

decreasing the level of the reference voltage when the detecting result indicates that the duty cycle of the compared data signal is less than 50%; and increasing the level of the reference voltage when the detecting result indicates that the duty cycle of the compared data signal is bigger than 50%.

12. The memory control method of claim 7, further comprising:

adjusting the level of the reference voltage actively, and comparing the data signal with the reference voltage constantly to generate the compared data signal, and measuring the eye width of the compared data signal to generate the measuring result; and increasing or decreasing the level of the reference voltage constantly according to the measuring result until the measuring result indicates that the eye width of the compared data signal reaches a maximum value.

13. A memory control circuit, comprising:

a comparator arranged to compare a data signal with a reference voltage to generate a compared data signal;

an eye width measuring circuit, coupled to the comparator, arranged to measure an eye width of the compared data signal by using a plurality of clock signals with different phases to generate a measuring result;

a duty cycle detector circuit arranged to detect a duty cycle of the compared data signal to generate a detecting result; and a calibration circuit, coupled to the comparator, the eye width measuring circuit and the duty cycle detector circuit, arranged to adjust a level of the reference voltage according to the detecting result and the measuring result.

14. The memory control circuit of claim 13, wherein the calibration circuit decreases the level of the reference voltage when the detecting result indicates that the duty cycle of the compared data signal is less than 50%; and the calibration circuit increases the level of the reference voltage when the detecting result indicates that the duty cycle of the compared data signal is bigger than 50%.

\* \* \* \* \*